(12) United States Patent
Gardner et al.

(10) Patent No.: US 9,711,687 B2
(45) Date of Patent: Jul. 18, 2017

(54) LIGHT EMITTING DEVICE WITH IMPROVED EXTRACTION EFFICIENCY

(71) Applicant: KONINKLIJKE PHILIPS N.V., Eindhoven (NL)

(72) Inventors: Nathan Frederick Gardner, San Jose, CA (US); Werner Karl Goetz, San Jose, CA (US); Michael Jason Grundmann, San Jose, CA (US); Melvin Barker McLaurin, San Jose, CA (US); John Edward Epler, San Jose, CA (US); Michael David Camras, San Jose, CA (US); Aurelien Jean Francois David, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/948,042

(22) Filed: Nov. 20, 2015

(65) Prior Publication Data

US 2016/0163927 A1    Jun. 9, 2016

Related U.S. Application Data

(63) Continuation of application No. 13/882,511, filed as application No. PCT/IB2011/054847 on Nov. 1, 2011, now Pat. No. 9,209,359.

(Continued)

(51) Int. Cl.
*H01L 33/32* (2010.01)
*H01L 33/00* (2010.01)
(Continued)

(52) U.S. Cl.
CPC .......... *H01L 33/32* (2013.01); *H01L 33/007* (2013.01); *H01L 33/0079* (2013.01);
(Continued)

(58) Field of Classification Search
CPC ..... H01L 33/22; H01L 33/0079; H01L 33/32; H01L 33/02; H01L 33/007
(Continued)

(56) References Cited

U.S. PATENT DOCUMENTS 5,530,267 A * 6/1996 Brandle, Jr. ........ H01L 31/1852
257/76
5,709,745 A * 1/1998 Larkin .................... C30B 25/02
117/96

(Continued)

OTHER PUBLICATIONS

"Dry and Wet Etching os ScMgAlO4" Brandle et al., Solid-State Electronics 42, 467 (1998).

(Continued)

*Primary Examiner* — Fernando L Toledo
*Assistant Examiner* — Adam S Bowen
(74) *Attorney, Agent, or Firm* — Volpe and Koenig, P.C.

(57) ABSTRACT

In embodiments of the invention, a semiconductor structure comprising a III-nitride light emitting layer disposed between an n-type region and a p-type region is grown on a substrate. The substrate is a non-III-nitride material. The substrate has an in-plane lattice constant $a_{substrate}$. At least one III-nitride layer in the semiconductor structure has a bulk lattice constant $a_{layer}$ and $[(|a_{substrate} - a_{layer}|)/a_{substrate}]*100\%$ is no more than 1%. A surface of the substrate opposite the surface on which the semiconductor structure is grown is textured.

19 Claims, 2 Drawing Sheets

Related U.S. Application Data

(60) Provisional application No. 61/409,160, filed on Nov. 2, 2010.

(51) Int. Cl.
  *H01L 33/02* (2010.01)
  *H01L 33/22* (2010.01)
  *H01L 33/24* (2010.01)

(52) U.S. Cl.
  CPC ............. *H01L 33/02* (2013.01); *H01L 33/22* (2013.01); *H01L 33/24* (2013.01); *H01L 2924/0002* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2004/0070000 A1 | 4/2004 | Ng et al. | |
| 2005/0221521 A1* | 10/2005 | Lee | H01L 33/007 438/29 |
| 2006/0038190 A1 | 2/2006 | Park et al. | |
| 2006/0240585 A1 | 10/2006 | Epler et al. | |
| 2007/0072324 A1 | 3/2007 | Krames et al. | |
| 2007/0241352 A1* | 10/2007 | Yasuda | H01L 33/007 257/94 |
| 2007/0241673 A1* | 10/2007 | Yamada | G02B 5/045 313/506 |
| 2007/0295985 A1 | 12/2007 | Weeks, Jr. et al. | |
| 2009/0075412 A1 | 3/2009 | Lee et al. | |
| 2009/0128004 A1* | 5/2009 | Chao | H01L 33/20 313/498 |
| 2009/0130787 A1* | 5/2009 | Bader | H01L 33/46 438/29 |
| 2009/0212277 A1* | 8/2009 | Akita | B82Y 20/00 257/13 |
| 2010/0078660 A1 | 4/2010 | Moriyama et al. | |

OTHER PUBLICATIONS

"Suppression of Phase Separation in InGaN Layers Grown on Lattice Matched ZnO Substrates" Li et al., Journal of Crystal Growth 311, (2009) p. 4628-4631.

"Luminescence Characteristics of N-Polar GaN and InGaN Films" Masui et al., Japanese Journal of Applied Physics, 48 (2009) p. 071003-1-071003-5.

"Structural Classification of Ra03(MO)n Compounds (R=Sc, In, Y, or Lanthanides; A-Fe(III), Ga, Cr or Al; M-.." Kimizuka et al., Journal of Solid State Chemistry 78, 98-107.

PCT/IB2011/054847, "International Search Report", mailed Jul. 17, 2015, 5 pages.

* cited by examiner

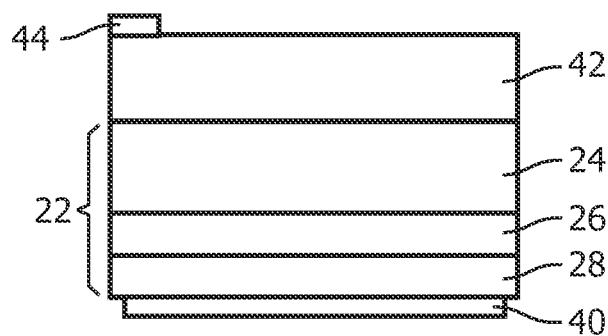
FIG. 4
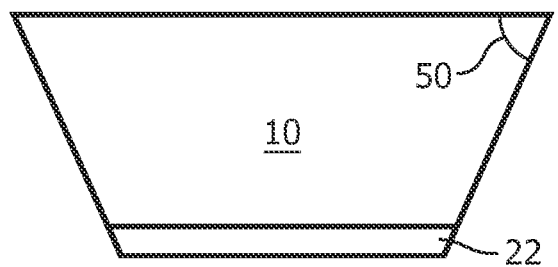
FIG. 5
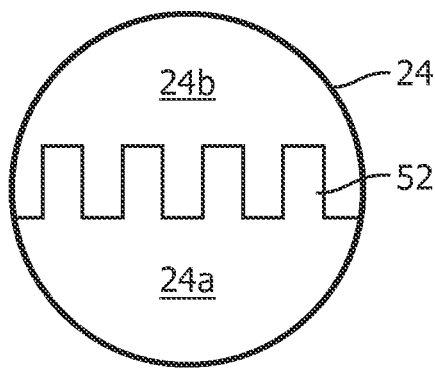 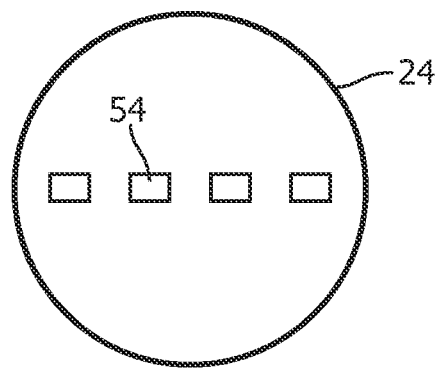
FIG. 6A          FIG. 6B

LIGHT EMITTING DEVICE WITH IMPROVED EXTRACTION EFFICIENCY

CROSS-REFERENCE TO RELATED APPLICATIONS

This application is a continuation of U.S. patent application Ser. No. 13/882,511, filed Oct. 21, 2013, to be issued as U.S. Pat. No. 9,209,359 on Dec. 8, 2015, which is a 371(c) national stage entry of PCT/IB2011/054847 filed Nov. 1, 2011, which is the international application of U.S. Provisional Patent Application Ser. No. 61/409,160, filed Nov. 2, 2010. U.S. Pat. No. 9,209,359 and PCT/IB2011/054847 are incorporated herein by reference.

BACKGROUND

Field of Invention

The present invention relates to a III-nitride light emitting device including a light extraction feature.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since native III-nitride substrates are generally expensive and not widely available, III-nitride devices are often grown on sapphire or SiC substrates. These non-III-nitride substrates are less than optimal because sapphire and SiC have different lattice constants than the III-nitride layers grown on them, causing strain and crystal defects in the III-nitride device layers, which can cause poor performance and reliability problems. In addition, light may be trapped inside the III-nitride structure by a waveguide formed at the interface between the III-nitride material and these non-III-nitride substrates.

SUMMARY

It is an object of the invention to provide a III-nitride device with a light extraction feature.

In embodiments of the invention, a semiconductor structure comprising a III-nitride light emitting layer disposed between an n-type region and a p-type region is grown on a substrate. The substrate is a non-III-nitride material and has an in-plane lattice constant $a_{substrate}$. At least one III-nitride layer in the semiconductor structure has a bulk lattice constant $a_{layer}$ and $[(|a_{substrate}-a_{layer}|)/a_{substrate}]*100\%$ is no more than 1%. A surface of the substrate opposite the surface on which the semiconductor structure is grown is textured. The texturing may improve light extraction.

In a method according to embodiments of the invention, a semiconductor structure comprising a III-nitride light emitting layer disposed between an n-type region and a p-type region is grown on a substrate. The substrate is removed. The substrate is a non-III-nitride material with an in-plane lattice constant $a_{substrate}$. At least one III-nitride layer in the semiconductor structure has a bulk lattice constant $a_{layer}$ and $[(|a_{substrate}-a_{layer}|)/a_{substrate}]*100\%$ is no more than 1%. A thickness of the semiconductor structure is selected to reduce a number of guided optical modes within the semiconductor structure, which may improve light extraction.

In a method according to embodiments of the invention, a substrate with a patterned surface is provided. The patterned surface comprises at least one region of lower elevation where a portion of the substrate is removed. A semiconductor structure comprising a III-nitride light emitting layer disposed between an n-type region and a p-type region is grown on the patterned surface, such that semiconductor material fills in the region of lower elevation. The substrate is removed such that the semiconductor material filling in the region of lower elevation remains part of the semiconductor structure, which may improve light extraction from the device.

The devices described herein may have less strain and therefore better performance than conventionally grown III-nitride light emitting devices. A light extraction feature, such as texturing or selecting a thickness to reduce guided optical modes in the device, is provided to improve light extraction from the device.

BRIEF DESCRIPTION OF THE DRAWINGS

FIG. 4 illustrates a portion of a III-nitride device with a thickness selected to maximize extraction efficiency.

FIG. 5 illustrates a III-nitride device formed in the shape of a truncated inverted pyramid.

FIGS. 6A and 6B illustrate portions of III-nitride semiconductor structures including embedded light extraction features.

DETAILED DESCRIPTION

Figure 1:
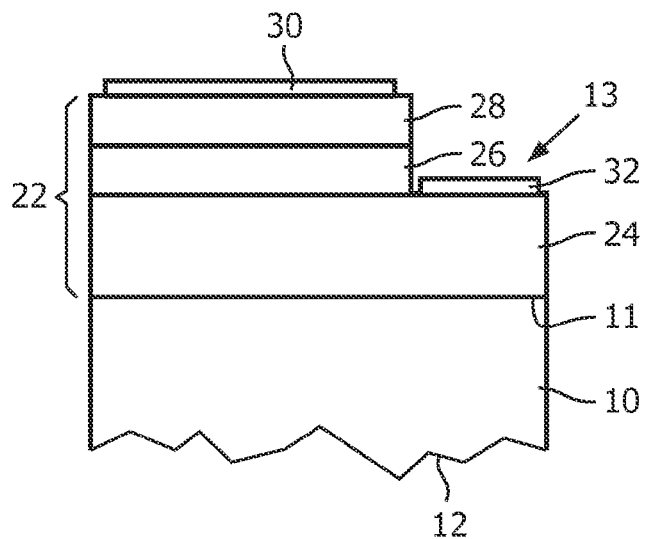
FIG. 1 illustrates a portion of a flip chip III-nitride device including a textured substrate.

The sapphire and SiC substrates upon which III-nitride LEDs are conventionally grown cannot be easily etched by wet chemistries. Thus, in order to form textured light extraction surfaces, the substrate is generally removed by a method such as laser lift-off in the case of sapphire. The III-nitride material exposed by removing the substrate may then be textured. Removing the substrate requires additional processing steps and can reduce yield. For example, laser lift-off can damage the III-nitride material, which may reduce manufacturing yields.

In embodiments of the invention, a substrate is provided which is lattice matched (or nearly so) to at least one III-nitride layer in the device. In some embodiments, the substrate has the same hexagonal symmetry as III-nitride material. Since the substrate is substantially lattice matched, the III-nitride structure grown on the substrate may be less strained than in a conventional device. In addition, in some embodiments, the substrate can be etched with a wet chemical etch to form light extraction features. In some embodiments, a wet chemical etch may be used to selectively etch the substrate from the III-nitride structure.

In various embodiments, light extraction may be improved by light extraction features etched into the substrate prior to deposition of the III-nitride structure, by light extraction features etched into the substrate after deposition of the III-nitride structure, and by growing a thin (<1 µm total thickness) III-nitride structure, then removing the substrate.

A III-nitride layer in a device may be characterized by a bulk lattice constant and an in-plane lattice constant. The bulk lattice constant is the lattice constant of a relaxed material with the same composition as the III-nitride layer. The in-plane lattice constant is the lattice constant of the III-nitride layer as grown in the device. If the III-nitride layer as grown in the device is strained, the bulk lattice constant is different from the in-plane lattice constant. The substrate on which the III-nitride structure is grown is a non-III-nitride material with an in-plane lattice constant within 1% of the bulk lattice constant of at least one deposited III-nitride layer in some embodiments, and within 0.5% of the bulk lattice constant of at least one deposited III-nitride in some embodiments. In other words, $[(|a_{substrate}-a_{layer}|)/a_{substrate}]*100\%$ is no more than 1% in some embodiments, no more than 0.5% in some embodiments, and no more than 0.1% in some embodiments. In some embodiments, the substrate has similar or the same hexagonal wurtzite symmetry as the III-nitride structure. In some embodiments, the substrate is substantially impervious to attack by the chemical and thermal environment experienced during the deposition of the III-nitride structure. In some embodiments, the substrate has an in-plane coefficient of thermal expansion within 30% of that of the III-nitride structure. In some embodiments, the substrate is a single crystal or substantially single crystal material.

In some embodiments, the substrate is a material of general composition $RAO_3(MO)_n$, where R is a trivalent cation, often selected from Sc, In, Y, and the lanthanides (atomic number 57-71); A is also a trivalent cation, often selected from Fe (III), Ga, and Al; M is a divalent cation, often selected from Mg, Mn, Fe (II), Co, Cu, Zn and Cd; and n is an integer ≥1. In some embodiments, n≤9 and in some embodiments, n≤3. In some embodiments, $RAMO_4$ (i.e., n=1) compounds are of the $YbFe_2O_4$ structure type, and $RAO_3(MO)_n$ (n≥2) compounds are of the $InFeO_3(ZnO)_n$ structure type.

Examples of suitable substrate materials include the following materials:

| Material | Lattice constant a (Å) | Appearance | y in lattice-matched $Al_xIn_yGa_{1-x-y}N$, x = 0 |
|---|---|---|---|
| $InFeZn_2O_5$ | 3.309 | Brown | 0.34 |
| $InFeZn_8O_{11}$ | 3.276 | Brown | 0.25 |
| $ScGaMgO_4$ | 3.272 | Transparent | 0.24 |
| $ScAlMgO_4$ | 3.236 | Transparent | 0.14 |
| $InAlMgO_4$ | 3.29 | Transparent | 0.29 |
| $ScAlMnO_4$ | 3.26 | Transparent | 0.20 |
| $InFeMnO_4$ | 3.356 | Brown | 0.48 |
| $InAlMnO_4$ | 3.319 | Black | 0.37 |
| $InAlCoO_4$ | 3.301 | Black | 0.32 |
| $InGaFeO_4$ | 3.313 | Black | 0.36 |

These and related substrate materials are described in detail by Kimizuka and Mohri in "Structural Classification of $RAO_3(MO)_n$ Compounds (R=Sc, In, Y, or Lanthanides; A=Fe(III), Ga, Cr, or Al; M=Divalent Cation; n=1-11)", published in Journal of Solid State Chemistry 78, 98 (1989), which is incorporated herein by reference.

A III-nitride structure is deposited on the substrate by any of the means known in the art, including, for example, MOCVD, hydride vapor phase epitaxy, or MBE. Perfect lattice match between the III-nitride structure and the substrate is not necessary, although lattice match within 0.1% is desirable in some embodiments. For purposes of embodiments of the present invention, the bulk lattice constant of a ternary or quaternary AlInGaN layer may be estimated according Vegard's law, which for $Al_xIn_yGa_zN$ may be expressed as $a_{AlInGaN}=x(a_{AlN})+y(a_{InN})+z(a_{GaN})$, where the variable "a" refers to the bulk a-lattice constant of each binary material and x+y+z=1. AlN has a bulk lattice constant of 3.111 Å, InN has a bulk lattice constant of 3.544 Å, and GaN has a bulk lattice constant of 3.1885 Å.

In some embodiments, the III-nitride structure is grown on a surface of the substrate that is "miscut" or angled relative to a major crystallographic plane of the substrate. In some embodiments, the surface of the substrate on which the III-nitride structure is grown may be oriented between −10 and +10 degrees away from the basal (0001) plane. In some embodiments, miscuts between −0.15 and +0.15 degrees tilted from the (0001) plane may result in large atomic terraces on the substrate surface that may desirably reduce the number of defects formed at terrace edges.

Though in the examples below the semiconductor device structure is a III-nitride LED that emits blue or UV light, electronic and optoelectronic devices besides LEDs such as laser diodes, high electron mobility transistors, and heterojunction bipolar transistors may be formed according to embodiments described herein.

As a preliminary matter, a semiconductor structure 22 as illustrated in FIGS. 1-4 is grown over substrate 10. The semiconductor structure 22 includes a light emitting or active region 26 sandwiched between n- and p-type regions 24 and 28. An n-type region 24 is often grown first and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. A light emitting or active region 26 is grown over the n-type region 24. Examples of suitable light emitting regions 26 include a single thick or thin light emitting layer, or a multiple quantum well light emitting region including multiple thin or thick light emitting layers separated by barrier layers. A p-type region 28 is grown over the light emitting region 26. Like the n-type region 24, the p-type region 28 may include multiple layers of different composition, thickness, and dopant concentration, including layers that are not intentionally doped, or n-type layers.

In the embodiments described below, etching or texturing steps may be performed by any suitable etch such as for example, wet chemical etching. For example, $ScMgAlO_4$ is readily attacked by aqueous mixtures of $H_3PO_4$ and $H_2O_2$, $H_2SO_4:H_2O_2:H_2O$, and aqueous mixtures of HF, as reported by C. D. Brandle, et al. in "Dry and Wet Etching of $ScMgAlO_4$," published in Solid-State Electronics, 42, 467 (1998), which is incorporated herein by reference. In some embodiments, etching or texturing is performed by reactive ion etching using a gaseous mixture of $Cl_2$ and Ar at an applied power of 800 Watts.

In the device illustrated in FIG. 1, the III-nitride structure 22 is grown on face 11 of substrate 10. The total thickness of the semiconductor structure 22 is between 2 and 100 µm in some embodiments and between 3 and 6 µm in some embodiments. The face 12 of substrate 10 opposite the III-nitride structure 22 is textured, for example by roughening, which is random, or patterning, which may be ordered or random, to enhance the extraction of light from the III-nitride structure 22. In some embodiments, face 12 is textured by forming hexagonal pyramids. The pyramids have bases between 100 nm and 1 µm wide in some embodiments and may be spaced between 100 nm and 1 µm apart in some embodiments. The pyramids may be formed naturally during wet etching. In some embodiments, face 12 is textured by conventional patterning. For example, face 12 may be etched to form a lattice of posts, or a lattice of holes. The posts or holes may be arranged in any suitable lattice such as a triangular, square, hexagonal, or Archimedean lattice. The posts or holes may be between 100 nm and 1 µm wide in some embodiments, between 100 nm and 1 µm deep or tall in some embodiments, and spaced between 100 nm and 1 µm apart in some embodiments. In some embodiments, a mask with a 'random' pattern is formed over the substrate, then the substrate is etched with, for example, a wet etch. A mask with a random pattern may be formed by, for example, oxidizing a metal such as aluminum. Face 12 may be textured before or after III-nitride structure 22 is grown. Face 12 may be roughened by, for example, mechanical means such as grinding or by wet etching. Face 12 may be patterned by, for example, conventional lithographic patterning and wet etching. When the refractive index of substrate 10 is close to the refractive index of III-nitride structure 22, the extraction benefit provided by roughening or patterning face 12 is greater than when the refractive index of substrate 10 is much less than the refractive index of III-nitride structure 22. GaN has a refractive index of 2.4. Accordingly, the refractive index of the substrate 10 is at least 2.0 in some embodiments, at least 2.2 in some embodiments, and at least 2.4 in some embodiments.

After growth of III-nitride structure 22, a metal p-contact 30 is formed on the p-type region 28, then a mesa structure 13 is etched into the III-nitride structure 22, exposing a portion of the n-type region 24 on which a metal n-contact 32 is formed. One or both of n- and p-contacts 30 and 32 may be reflective. The device may be mounted in a flip-chip configuration on any suitable mount (not shown in FIG. 1) such that light is extracted from the device through face 12 of substrate 10.

Figure 2:
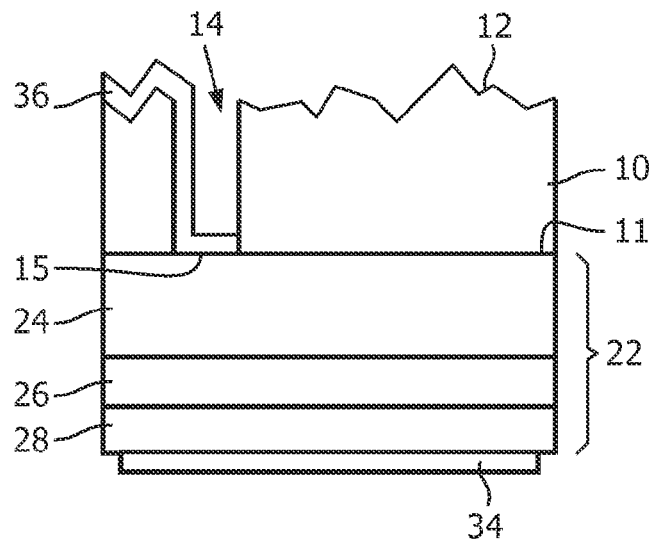
FIG. 2 illustrates a portion of a vertical current injection III-nitride device including a textured substrate.

In the device illustrated in FIG. 2, a III-nitride structure 22 is grown on the face 11 of substrate 10. A metal p-contact 34 is deposited on the p-type region 28. The face 12 of substrate 10 opposite the III-nitride structure 22 is patterned with one or more vias 14 formed by masking the substrate using standard photolithographic techniques and using, for example, a solution containing HF or any other suitable etch to selectively etch holes through the substrate all the way to the n-type region 24. Though only one via 14 is illustrated in FIG. 2, many vias may be formed on a single device. Vias 14 may be, for example, at least 100 nm wide in some embodiments and between 100 nm and 5 µm wide in some embodiments. Neighboring vias 14 may be spaced at least 50 µm apart in some embodiments, between 50 µm and 500 µm apart in some embodiments, and between 100 µm and 300 µm apart in some embodiments. Current spreading in the device favors wider vias more narrowly spaced, while avoiding loss of light by shadowing caused by the vias favors narrower vias more widely spaced. In some embodiments, substrate 10 may be thinned before forming vias 14. For example, substrate 10 may be on the order of 1 mm thick before thinning in some embodiments, and may be thinned to a thickness that is mechanically self supporting, for example between 100 µm and 500 µm in some embodiments.

A metal n-contact 36 is formed on the surface 15 of the n-type region 24 exposed by forming via 14. N-contact 36 may cover all or a portion of the sidewall of via 14 and a portion of the surface 12 of substrate 10, as illustrated in FIG. 2. Substrate surface 12 may be textured as illustrated in FIG. 2, before or after forming via 14. The portion of substrate surface 12 under n-contact 36 may be textured as illustrated in FIG. 2, or it may be left untextured, for example by conventional masking steps. The device may be attached to a mount through p-contact 34. Electrical connection to n-contact 36 may be made by any suitable connection such as a wire-bond. P-contact 34 may be reflective. Light is extracted from the device through surface 12 of substrate 10. In some embodiments, the device of FIG. 2 is connected to a mount through p-contact 34 on a wafer scale, then substrate 10 is thinned to a thickness that is not mechanically self-supporting, for example 50 µm or less in some embodiments, 20 µm or less in some embodiments, and 10 µm or less in some embodiments. Via 14 may be formed before or after thinning. Though the remaining thin portion of substrate 10 may not be mechanically self supporting, it may provide mechanical robustness which may protect the semiconductor structure 22 during subsequent processing steps. For example, the remaining thin portion of substrate 10 may protect the semiconductor structure from damage when a bond pad and bond are formed on n-contact 36.

Figure 3:
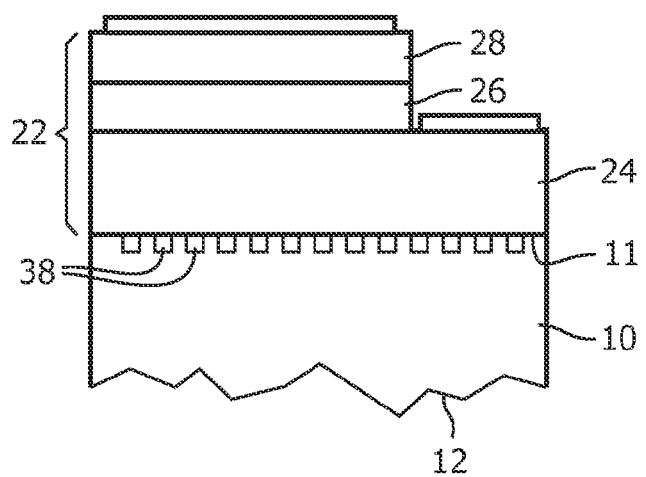
FIG. 3 illustrates a portion of a III-nitride device grown over light extraction features formed on a substrate.

In the device illustrated in FIG. 3, the face 11 of substrate 10 on which semiconductor structure 22 is grown is patterned prior to deposition of the semiconductor structure 22. The pattern may include at least one region of lower elevation where the substrate is removed, for example a hole or a region between two posts. The pattern may be produced by creating a mask using standard photolithographic techniques and then etching holes or posts 38 into the substrate with, for example, a solution containing HF or any other suitable etch. Holes or posts 38 may be between 100 nm and 1 µm wide in some embodiments and between 100 nm and 1 µm deep or tall in some embodiments. Semiconductor structure 22 is then grown on substrate 10 as described above. In some embodiments semiconductor material fills the holes or fills in the space between posts. The difference in refractive index between substrate 10 and the semiconductor material filling holes 38 or filling the space between posts 38 may cause scattering which may improve light extraction from the device. In some embodiments, holes or posts 38 are arranged in a lattice and form a photonic crystal. In a conventional device, due to the lattice constant difference between the semiconductor material and the substrate, the n-type region must be grown thick in order to be grown with sufficiently high quality. In the device of FIG. 3, because the n-type region 24 is more closely lattice-matched to the substrate 10, the n-type region 24 may be thinner than in a conventional device, which advantageously places the photonic crystal closer to the light emitting region 26. For example, in a conventional device, the n-type region may be at least 5 µm thick. In the device of FIG. 3, the n-type region may be between 500 nm and 2 µm thick.

In some embodiments, a light extraction structure is embedded in a semiconductor layer of the device, as illustrated in FIGS. 6A and 6B. Though FIGS. 6A and 6B illustrate a light extraction structure embedded in n-type region 24, a light extraction structure may be embedded in any semiconductor layer in the device. In the portion of the semiconductor structure illustrated in FIG. 6A, a first portion 24a of n-type region 24 is grown, then a pattern 52 is formed, for example by etching portion 24a or selectively growing portion 24a, for example through a patterned mask. Pattern 52 may include at least one region of lower elevation, for example a hole or a region between two posts. Pattern 52 may be holes or posts, which in some embodiments are arranged in a lattice and form a photonic crystal. After pattern 52 is formed, a second portion 24b of n-type region 24 is grown over pattern. In some embodiments materials 24a and 24b have different indices of refraction and semiconductor material 24b fills the holes or fills in the space between posts. The difference in refractive index between first portion 24a and second portion 24b may cause scattering which may improve light extraction from the device. For example, in a device grown on a ScMgAlO$_4$ substrate, first portion 24a may be one of In$_{0.14}$Ga$_{0.86}$N and In$_{0.3}$Al$_{0.7}$N and second portion 24b may be the other of In$_{0.14}$Ga$_{0.86}$N and In$_{0.3}$Al$_{0.7}$N. The features of pattern 52 may have a width and depth of between 50 and 1000 nm in some embodiments. In some embodiments, second material 24b is grown such that voids are formed in pattern 52, which may cause scattering which may improve light extraction from the device. In the portion of the semiconductor structure illustrated in FIG. 6B, a first portion of the n-type region is grown, regions of a material with a different index 54 are formed over the first portion of the n-type region, then a second portion of the n-type region is grown over the regions of material with different index 54. Regions of material with a different index 54 may be, for example, an oxide of silicon, a nitride of silicon, SiO$_2$, Si$_3$N$_4$, or air.

The device illustrated in FIG. 3 may be processed into either the flip chip configuration illustrated in FIG. 1 or the vertical current injection configuration illustrated in FIG. 2. In some embodiments, the surface 12 of substrate 10 from which light is extracted from the device may also be textured, as described above in reference to FIGS. 1 and 2. Texturing both faces 11 and 12 of substrate 10 may result in greater light extraction efficiency than texturing only one surface as illustrated in FIGS. 1 and 2.

In some embodiments, substrate 10 of FIG. 3 is removed from semiconductor structure 22, for example by etching with an etch that removes substrate 10 without attacking the III-nitride semiconductor structure. The surface of semiconductor structure 22 exposed by etching away substrate 10 includes a pattern of semiconductor material formed during growth of semiconductor structure 22, when the semiconductor material filled the holes or filled in the space between the posts on the patterned surface 11 of substrate 10.

In one example of a suitable semiconductor structure 22 for the devices illustrated in FIGS. 1, 2, and 3, a layer 24 of n-type In$_{0.12}$Ga$_{0.88}$N is deposited on a ScMgAlO$_4$ substrate 10. A light-emitting layer 26 formed of In$_{0.14}$Ga$_{0.86}$N is deposited on the n-type layer 24. A p-type layer stack 28 formed of GaN and In$_{0.12}$Ga$_{0.88}$N is deposited on the light-emitting layer 26. The ScMgAlO$_4$ substrate 10 may be randomly textured by etching in a solution of H$_2$SO$_4$:H$_2$O for 10 minutes, or patterned by conventional lithographic steps, then etched with HF.

In structures where the substrate 10 remains a part of the finished device, such as the devices illustrated in FIGS. 1, 2, and 3, in some embodiments the substrate 10 alone or both the substrate 10 and the semiconductor structure 22 are shaped, for example to improve light extraction. FIG. 5 illustrates a device formed into the shape of a truncated inverted pyramid. As illustrated in FIG. 5, the top and side surfaces of the substrate 10 form an acute angle. In some embodiments, the top and side surfaces of the substrate 10 may form an obtuse angle, or may be joined by curved surface. A device may be shaped by, for example, beveled saw cuts, shaping with a sharp blade, grinding, etching, or some of the methods for removing the substrate described below. In some embodiments, substrate 10 of FIG. 5 is transparent and the device is a flip chip such that light is extracted from the device through substrate 10.

In the device illustrated in FIG. 4, the light extraction feature is the thickness of the semiconductor structure 22, which is selected to maximize the extraction efficiency by minimizing the number of guided optical modes within the structure. The thickness depends on the refractive index of the semiconductor material and the substrate, and the wavelength of emitted light in the semiconductor. The total thickness of semiconductor structure 22, including all III-nitride layers in the device, is between 200 nm and 2 µm in some embodiments and between 500 nm to 1 µm in some embodiments. In the device illustrated in FIG. 4, a semiconductor structure 22 is grown on a substrate as described above. A metal p-contact 40 is deposited on the p-type region 28. The structure including the substrate, semiconductor structure 22, and p-contact 40 is attached to a mount (not shown in FIG. 4) through p-contact 40, for example by a metal-metal bond or by solder.

The substrate is then removed by any suitable method or combination of methods. A transparent substrate may be removed by laser lift off, where the layer of III-nitride material grown first on the substrate absorbs the laser light and melts, releasing semiconductor structure 22 from the substrate. Laser lift-off may be facilitated by an optional layer of narrower-energy-gap material grown first on the substrate. The composition of the narrower-energy-gap layer may be selected such that it absorbs more of the incident laser light than the rest of semiconductor structure 22, which may reduce the incident flux required and may produce less distributed damage throughout the semiconductor structure 22.

In some embodiments, an optional zone of weakness is provided at or near the interface of the III-nitride material and the substrate in order to encourage the fracture of that interface and thereby make it easier to remove the semiconductor structure 22 from the substrate. A zone of weakness may be provided in the substrate or semiconductor structure 22 by implanting one or more of H or N or other atoms prior to or after deposition of all or part of the semiconductor structure 22. A zone of weakness in semiconductor structure 22 may be provided by first growing a layer with a higher mole fraction of InN (at a certain growth temperature), then growing a layer with a lower mole fraction of InN. The higher-InN-bearing layer may transform at higher growth temperatures used to grow the remaining semiconductor structure 22 according to its phase diagram into regions of even higher and lower indium composition. The regions of highest indium composition are more absorbent of incident laser light, and the mechanical stress due to the spatially varying indium composition may create a layer of mechanical weakness in the semiconductor structure.

A zone of weakness may also be provided at the semiconductor structure/substrate interface by exposing the wafer to a pattern of tightly focused, pulsed laser beams of sufficient intensity and photon energy to create a plurality of micron-scale crystal defects or voids in the crystalline structure. The pattern of crystal damage may be generated by rastering one or more laser beams across the wafer, or by using diffractive optics to generate a large number of spots from a single high power laser such as an excimer laser. The laser beams may be strongly converging with a short sub-microsecond pulse, and may create highly localized damage. This exposure could occur through the epitaxy stack after growth with sufficiently low dose that further wafer processing may be done after exposure. In some embodiments, the substrate is removed after the subsequent wafer processing, for example in a die-level rather than a wafer-level process. Also, the total power of the exposure may be less than required for traditional laser lift-off, which may result in less mechanical shock.

A zone of weakness may also be provided at the semiconductor structure/substrate interface by patterning the surface of the substrate (e.g. with a rectangular or triangular lattice of ridges of substrate material) prior to deposition of the semiconductor structure 22.

Substrate materials shown in the table above have micaceous character, wherein the basal plane of the crystal (i.e. the face parallel to the surface of the substrate in the case where the substrate orientation is (0001)) preferentially fractures. Such substrates may be removed by mechanical methods including but not limited to mechanical grinding, applying a rotational force between the substrate and the semiconductor structure, attaching an adhesive-coated plastic film to the substrate and a second adhesive-coated plastic film to the semiconductor structure and pulling the substrate and semiconductor structure apart, using a sharp blade to break the interface between the substrate and the semiconductor structure, using a pulse of sonic energy or inhomogeneous temperature distribution to break the interface between the substrate and the semiconductor structure, and applying a temperature gradient across the surface normal of the semiconductor structure and substrate (for example, higher temperature applied to one face of the semiconductor structure, and lower temperature applied to one face of the substrate), such that the thermally induced stress in the plane of the semiconductor structure/substrate interface is sufficient to cause fracture of that interface.

In some embodiments, the substrate is removed by wet chemical etching. For example, $ScMgAlO_4$ is readily attacked by aqueous mixtures of $H_3PO_4$ and $H_2O_2$, $H_2SO_4$: $H_2O_2$:$H_2O$, and aqueous mixtures of HF, as reported by C. D. Brandle, et al. in "Dry and Wet Etching of ScMgAlO4" published in Solid-State Electronics, 42, 467 (1998). In some embodiments, all or part of growth substrate 30 is removed by reactive ion etching using a gaseous mixture of $Cl_2$ and Ar at an applied power of 800 Watts. In some embodiments, the final removal step is a wet chemical etch with HF. In some embodiments, after removing the substrate, the surface of the semiconductor material may be treated, for example to planarize the surface and/or to remove damage caused by etching. For example, the surface may be planarized by grinding, then cleaned with a wet etch.

A layer of conductive, transparent metal oxide 42 such as indium tin oxide, zinc oxide, magnesium-doped zinc oxide, aluminum-doped magnesium-doped zinc oxide, gallium-doped magnesium-doped zinc oxide, aluminum-doped zinc oxide, gallium-doped zinc oxide, or ruthenium oxide, for example, is deposited on the surface of n-type region 24 exposed by removing the substrate. Conductive layer 42 may form an n-contact with sufficient current spreading capability. In some embodiments, conductive layer 42 serves as a current spreading layer and a separate metal n-contact 44 is formed on conductive layer 42. Conductive layer 42 may be between 100 nm and 1 μm thick in some embodiments and between 100 nm and 300 nm thick in some embodiments. Light is extracted from the device through conductive layer 42.

In one example of a device as illustrated in FIG. 4, a layer of n-type $In_{0.12}Ga_{0.88}N$ 24 is deposited on a $ScMgAlO_4$ substrate. A light-emitting layer 26 formed of $In_{0.14}Ga_{0.86}N$ is deposited on the n-type layer 24. A p-type layer stack 28 formed of GaN and $In_{0.12}Ga_{0.88}N$ is deposited on the light-emitting layer 26.

The devices described above may be combined with one or more wavelength converting materials such as phosphors, quantum dots, or dyes to create white light or monochromatic light of other colors. All or only a portion of the light emitted by the LED may be converted by the wavelength converting materials. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device.

The wavelength converting element may be, for example, a pre-formed ceramic phosphor layers that is glued or bonded to the LED or spaced apart from the LED, or a powder phosphor or quantum dots disposed in an organic or inorganic encapsulant that is stenciled, screen printed, sprayed, sedimented, evaporated, sputtered, or otherwise dispensed or deposited over the LED.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
    a substrate; and
    a semiconductor structure grown on the substrate, the semiconductor structure comprising a III-nitride light emitting layer disposed between an n-type region and a p-type region;
    wherein:
        the substrate is a non-III-nitride material;
        the substrate has an in-plane lattice constant $a_{substrate}$;
        at least one III-nitride layer in the semiconductor structure has a bulk lattice constant $a_{layer}$;
        $[(|a_{substrate} - a_{layer}|)/a_{substrate}]*100\%$ is no more than 1%; and
        a surface of the substrate on which the semiconductor structure is grown is angled relative to a major crystallographic plane of the substrate.

2. The device of claim 1 wherein the surface of the substrate on which the semiconductor substrate is grown is oriented between −10 and +10 degrees away from a basal (0001) plane.

3. The device of claim 1 wherein the surface of the substrate on which the semiconductor substrate is grown is angled such that large atomic terraces form on surface of the substrate on which the semiconductor substrate is grown.

4. The device of claim 1 wherein a surface of the substrate opposite a surface on which the semiconductor structure is grown is textured.

5. The device of claim 1 wherein the substrate is ScMgAlO$_4$.

6. The device of claim 1 wherein the substrate is RAO$_3$(MO)$_n$, where R is selected from Sc, In, Y, and the lanthanides; A is selected from Fe (III), Ga, and Al; M is selected from Mg, Mn, Fe (II), Co, Cu, Zn and Cd; and n is an integer $\geq 1$.

7. The device of claim 1 wherein the substrate has an index of refraction of at least 2.0.

8. The device of claim 1 wherein the surface of the substrate on which the semiconductor structure is grown is textured.

9. The device of claim 1 further comprising a lattice of holes or posts formed on the surface of the substrate on which the semiconductor structure is grown.

10. The device of claim 1 wherein the substrate is shaped into a truncated inverted pyramid.

11. The device of claim 1 further comprising a photonic crystal formed in one of a surface of the substrate on which the semiconductor structure is grown and a semiconductor layer in the semiconductor structure.

12. The device of claim 1 wherein the surface of the substrate opposite the surface on which the semiconductor structure is grown is textured with hexagonal pyramids.

13. The device of claim 1 wherein the semiconductor structure is attached to a mount and the substrate is less than 50 µm thick.

14. A device comprising:
a substrate;
a semiconductor structure grown on the substrate, the semiconductor structure comprising a III-nitride light emitting layer disposed between an n-type region and a p-type region; and
a pattern disposed within the n-type region, the pattern comprising:
a first n-type layer with a pattern formed on a top surface of the first n-type layer; and
a second n-type layer disposed over the top surface of the first n-type layer, wherein the first and second n-type layers have different indices of refraction;
wherein:
the substrate is a non-III-nitride material;
the substrate has an in-plane lattice constant a$_{substrate}$;
at least one III-nitride layer in the semiconductor structure has a bulk lattice constant a$_{layer}$; and
[(|a$_{substrate}$−a$_{layer}$|)/a$_{substrate}$]* 100% is no more than 1%.

15. The device of claim 14 wherein the second n-type layer fills in regions between features that form the pattern.

16. The device of claim 14 wherein the pattern comprises at least one region of lower elevation.

17. The device of claim 16 wherein the at least one region of lower elevation is one of a hole and a region between two posts.

18. The device of claim 14 wherein the pattern comprises holes arranged in a lattice to form a photonic crystal.

19. The device of claim 14 wherein the pattern comprises posts arranged in a lattice to form a photonic crystal.

* * * * *